United States Patent [19]
Harada et al.

[11] Patent Number: 5,792,326
[45] Date of Patent: Aug. 11, 1998

[54] METHOD AND APPARATUS FOR GENERATING OZONE AND METHODS OF ITS USE

[76] Inventors: Minoru Harada, 1-9-22-406, Inari, Fujisawa-shi, Kanagawa-ken; Ryoichi Shinjo, 1423-620, Futoo-cho, Kohoku-ku, Yokohama-shi, Kanagawa-ken; Manabu Tsujimura, 4-44-8, Sakaecho-dori, Tsurumi-ku, Yokohama-shi, Kanagawa-ken; Rempei Nakata, 310-222, Iwase, Kamakura-shi, Kanagawa-ken; Kunihiro Miyazaki, Kureare-heiwadai 208, 3-17-17, Heiwadai, Nerima-ku, Tokyo; Naruhiko Kaji, 661-1-202, Kamigo-cho, Sakae-ku, Yokohama-shi, Kanagawa-ken; Yutaka Nakano, 5-15-704, Minamiyawata 4-chome, Ichikawa-shi, Chiba-ken, all of Japan

[21] Appl. No.: 782,390

[22] Filed: Jan. 13, 1997

Related U.S. Application Data

[62] Division of Ser. No. 518,418, Aug. 23, 1995, Pat. No. 5,632,868.

[30] Foreign Application Priority Data

Aug. 24, 1994 [JP] Japan ................................ 6-224151
Nov. 9, 1994 [JP] Japan ................................ 6-299092

[51] Int. Cl.$^6$ ........................................................ C01B 13/10
[52] U.S. Cl. ............................................. 204/176; 427/255.3
[58] Field of Search ................................ 204/176; 427/255.3

[56] References Cited

U.S. PATENT DOCUMENTS

| | | | |
|---|---|---|---|
| 2,700,648 | 1/1955 | Thorp et al. | 204/176 |
| 2,857,323 | 10/1958 | Cromwell | 204/176 |
| 5,294,571 | 3/1994 | Fujishiro et al. | 437/239 |
| 5,370,846 | 12/1994 | Yokomi et al. | 422/186.07 |
| 5,518,962 | 5/1996 | Murao | 437/195 |

FOREIGN PATENT DOCUMENTS 6-21010   3/1994   Japan.

OTHER PUBLICATIONS

Database WP—Derwent Publications Ltd., London, GB (Abstract of JP-A-57-183 304, 11 Nov. 1982).
Patent Abstracts of Japan—vol. 006 No. 180 (C-125), 14 Sep. 1982 Abstract of JP-A-57 095808.
Chemical Abstracts, vol. 114, No. 4, 28 Jan. 1991, Abstract No. 26681v (Abstract of JP-A-02-208 204).

*Primary Examiner*—Kathryn L. Gorgos
*Assistant Examiner*—Kishor Mayekar
*Attorney, Agent, or Firm*—Armstrong, Westerman, Hattori, McLeland & Naughton

[57] ABSTRACT

Ozonizer (10) which supplies a feed gas to ozone generating cell (11) under application of a high voltage and which delivers an ozone gas through an ozone gas transport path (consisting of pipes (14) and (15)) as it has been generated in said ozone generating cell (11) is characterized in that the ozone gas transport path is furnished with means for removing at least one of NOx, HF and SOx (in the drawings, the means is for removing NOx) and that the ozone gas from the ozone generating cell (11) is passed through said removing means, whereby at least one of NOx, HF and SOx in said ozone gas is removed before it is delivered to a subsequent stage. The product ozone is not contaminated with Cr compounds at all or insufficiently contaminated to cause any practical problems in the fabrication of highly integrated semiconductor devices.

Alternatively, ozonizer (10) which comprises an ozone generating cell (11) having an inlet (8) for supplying a feed gas, high voltage applying means (35) and an outlet (29) for discharging the ozone generated, and ozone delivery paths (30) and (31) for delivering the generated ozone is characterized in that oxygen (1) supplemented with 10-20 vol % of carbon dioxide and/or carbon monoxide (2) is used as the feed gas. The thus produced ozone is significantly low in the level of Cr compounds and, hence, can suitably be used in the formation of metal oxides, in particular, silicon oxide.

5 Claims, 7 Drawing Sheets

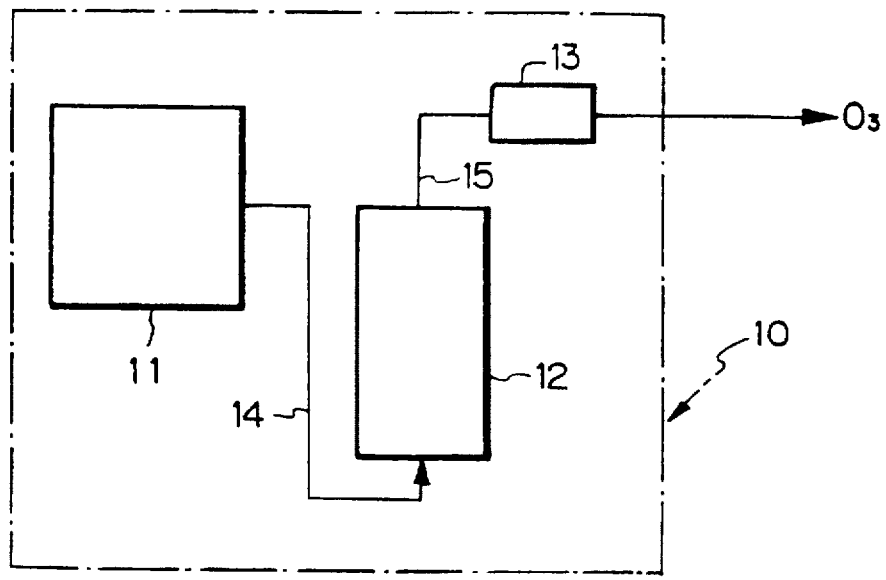
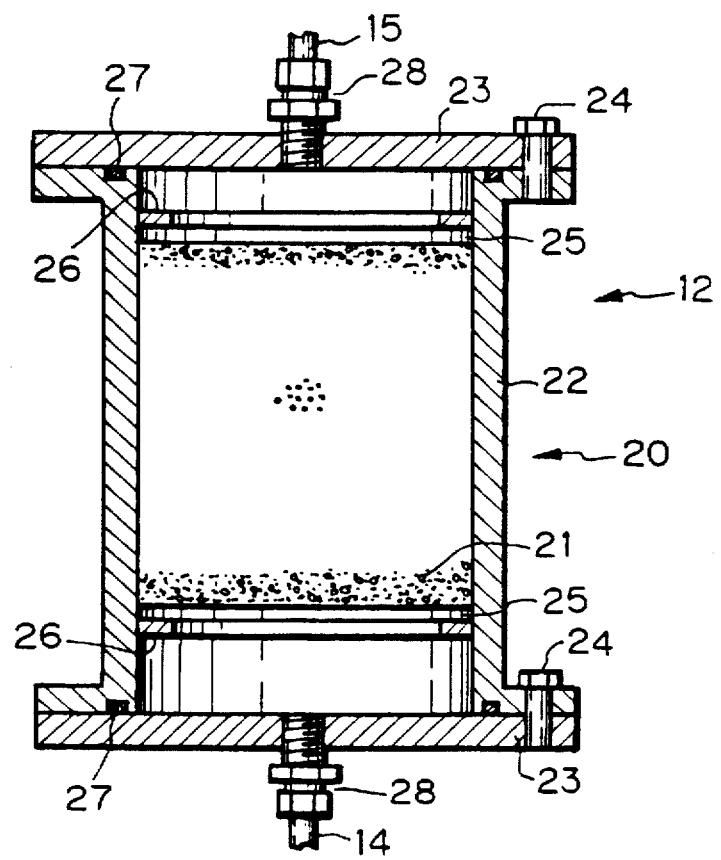

METHOD AND APPARATUS FOR GENERATING OZONE AND METHODS OF ITS USE

This is a division of application Ser. No. 08/518,418 filed Aug. 23, 1995, now U.S. Pat. No. 5,632,868.

BACKGROUND OF THE INVENTION

The present invention relates to a method for generating ozone. More particularly, it relates to a method and apparatus for producing an ozone gas of sufficiently high purity and concentration to be suitable for use in the semiconductor fabrication process and similar applications. The invention also relates to methods of using the thus produced ozone.

In ozonizers of the type contemplated by the invention which are capable of producing ozone gas of high purity and concentration, stainless steel has been used as a constituent material of the parts which are to come into contact with the ozone gas. Since the semiconductor fabrication process hates the emission of fine particles and out-gases, the stainless steel is used after it is subjected to electropolishing.

In addition, with a view to producing highly concentrated ozone, an oxygen gas supplemented with nitrogen gas has been used as a feed gas.

A problem with the use of stainless steel materials in those parts of an ozonizer which are to come into contact with the ozone gas is that very small amounts of chromium (Cr) compounds are contained in the product ozone gas. A plausible reason for the generation of Cr compounds is that since oxygen ($O_2$) gas supplemented with nitrogen ($N_2$) gas is used as a feed gas, NOx is produced by the nitrogen within ozone generating cells and the resulting NOx reacts with the very small amount of water which is adsorbed on the surface of the stainless steel, thereby yielding nitric acid which, in turn, reacts with the stainless steel to produce Cr compounds. In addition to NOx, SOx and HF are expected to form if $CF_4$, $SF_6$ and $NF_3$ are added to oxygen ($O_2$) gas and this would be another cause of the production of Cr compounds.

The contamination of ozone gas with small amounts of Cr compounds has not been a particular concern in the semiconductor fabrication process. However, with the recent expansion of the scope of applications of ozone gas, the Cr compounds in the ozone gas used in the semiconductor fabrication process are becoming a problem and yet there are no effective means available today for dealing with the problem.

SUMMARY OF THE INVENTION:

The present invention has been accomplished under these circumstances and has as the object of providing an ozonizer capable of significantly reducing Cr compounds by removing NOx, HF and SOx in ozone gas which are the cause of the generation of Cr compounds.

Another object of the invention is to provide a method capable of generating ozone gas that has a significantly reduced in the content of Cr compounds.

A further object of the invention is to provide an apparatus suitable for use in implementing the above-described method.

Still another object of the invention is to provide methods of using the thus produced ozone gas.

The first object of the invention can be attained by an ozonizer which supplies a feed gas to an ozone generating cell under application of a high voltage and which delivers an ozone gas through an ozone gas transport path as it has been generated in said ozone generating cell, characterized in that said ozone gas transport path is furnished with means for removing at least one of NOx, HF and SOx and that the ozone gas from said ozone generating cell is passed through said removing means, whereby at least one of NOx, HF and SOx in said ozone gas is removed before it is delivered to a subsequent stage.

In an embodiment of the invention, said removing means is a vessel filled with a zeolite material and so adapted as to permit the passage of the ozone gas through said vessel as it emerges from said ozone generating cell.

In another embodiment of the invention, said removing means has pure water contained in a vessel and so adapted as to permit the passage of the ozone gas, typically diffused through said pure water in the form of tiny bubbles, as it emerges from said ozone generating cell.

As described above, the ozone gas emerging from the ozone generating cell in the invention is passed through the vessel filled with a zeolite material, whereby the NOx, HF and SOx in the ozone gas are adsorbed on the zeolite, and are thus removed from the ozone gas. Alternatively, the ozone gas is passed through the pure water in the vessel, whereby the NOx, HF and SOx in the ozone gas are dissolved in the pure water, and are thus removed from the ozone gas. Since the ozone gas is free from the NOx, HF and SOx which are causes of the generation of Cr compounds, those parts of the transport path which are to come into contact with the ozone gas may use Cr-containing materials such as stainless steel and yet no Cr compounds will be generated that have the potential to contaminate the product ozone gas.

The second object of the invention can be attained by a method for generating ozone by applying a high voltage to an oxygen containing feed gas, characterized in that the feed gas consists of oxygen gas supplemented with 10–20 vol % of carbon dioxide and/or carbon monoxide.

The third object of the invention can be attained by an apparatus for generating ozone comprising an ozone generating cell having an inlet for supplying a feed gas, means for applying a high voltage and an outlet for discharging the ozone generated, and an ozone delivery path for delivering the generated ozone, characterized in that oxygen supplemented with 10–20 vol % of carbon dioxide and/or carbon monoxide is used as the feed gas.

The carbon dioxide and carbon monoxide which are mentioned above compare with a known nitrogen gas in that they are capable of increasing the concentration of ozone generated.

The fourth object of the invention can be attained by a method of forming a metal oxide film by the reaction between a metal or a metal compound and ozone, characterized in that said ozone is produced by applying a high voltage to a feed gas consisting of oxygen supplemented with carbon monoxide and/or carbon dioxide. Said metal and said metal compound may be silicon and an organosilane compound, respectively.

The fourth object of the invention can also be attained by a method of removing an organic compound by combustion with ozone, characterized in that said ozone is produced by applying a high voltage to a feed gas consisting of oxygen supplemented with carbon monoxide and/or carbon dioxide.

Using the above-described feed gas in the present invention ensures that even if the ozone gas delivery path located downstream of the ozone generating cell in the ozonizer uses, as in the prior art, a stainless steel in at least those parts which are to come into contact with the ozone gas, there will be no chance of Cr compounds being generated in the ozone gas delivery path which is located downstream of the ozone generating cell, thereby eliminating the possibility that the ozone gas of high purity and concentration which has been produced in the ozone generating cell will be contaminated by Cr compounds.

BRIEF DESCRIPTION OF THE DRAWINGS

FIG. 1 shows a schematic layout of the ozonizer according to the first aspect of the present invention;

FIG. 2 shows a schematic layout of the NOx removing means used in the ozonizer of the invention;

Figure 3:
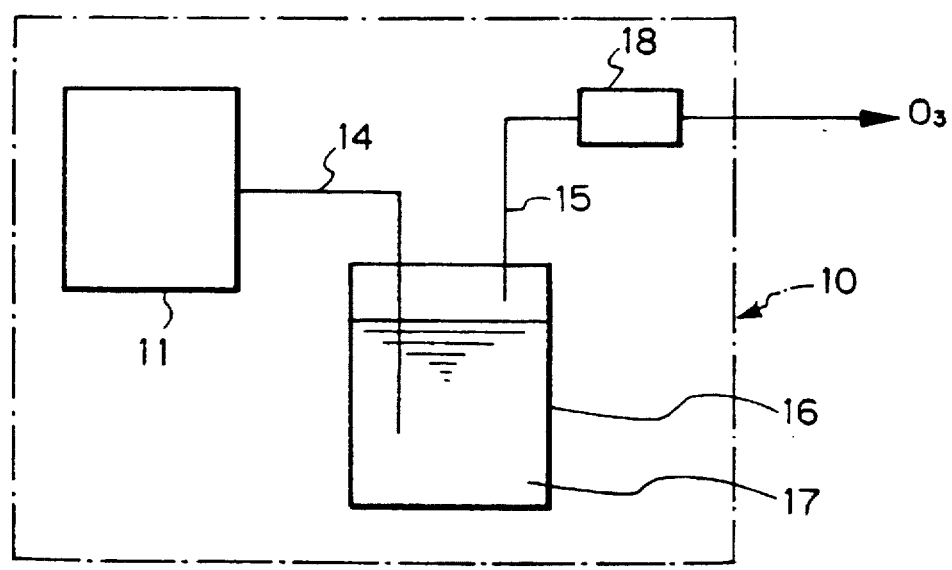
FIG. 3 shows another schematic layout of the ozonizer of the present invention.

DESCRIPTION OF THE PREFERRED EMBODIMENT:

The preferred examples of the present invention will now be described with reference to the accompanying drawings. FIG. 1 is a schematic layout of the ozonizer according to the first aspect of the invention. As shown, the ozonizer generally indicated by 10 comprises an ozone generating cell 11, a NOx removing means 12 and filter 13. The ozone generating cell 11 and the NOx removing means 12 are connected by a pipe 14 that uses a Cr-free material such as Teflon in at least those parts which are to come into contact with the ozone gas, and said NOx removing means 12 and the filter 13 are connected by a pipe 15 that is composed of Teflon or a Cr-containing material such as a stainless steel.

The ozone generating cell 11 is such that a high-frequency high voltage is applied between the electrodes to produce a discharge such as silent discharge; it is supplied with a feed gas consisting of oxygen ($O_2$) gas supplemented with nitrogen ($N_2$) gas and generates an ozone ($O_3$) gas (8 vol %). When oxygen ($O_2$) gas supplemented with nitrogen ($N_2$) gas is thus supplied as a feed gas, NOx is contained in the product ozone gas as already described in connection with the prior art. Such NOx containing ozone gas is passed through the NOx removing means 12 via pipe 14, whereby the NOx is removed from the ozone gas. The NOx-free ozone gas in turn is passed through the filter 13, whereby particles and other impurities are removed from the ozone gas which is delivered from the ozonizer 10 to a subsequent process.

Thus, the ozone gas emerging from the ozone generating cell 11 is freed of the NOx by the NOx removing means 12 and, even if the ozone gas transport path including the pipe 15 which is located downstream of the removing means 12 uses a Cr-containing constituent material such as a stainless steel pipe in those areas which are to come into contact with the ozone gas, the latter will not be contaminated by Cr compounds in the absence of NOx which is the cause of the generation of Cr compounds.

FIG. 2 shows a schematic layout of the NOx removing means 12 in the form of a vessel 20 filled with a NOx adsorbent 21. Vessel 20 comprises a cylindrical outer tube 22 closed with a flange 23 at both top and bottom ends, with two mesh plates 25 being spaced apart within the outer tube 22 in a vertical direction by means of retainer rings 26, and with the NOx adsorbent 21 being packed between the two mesh plates 25. Further referring to FIG. 2, the upper and lower flanges 23 are secured to the outer tube 22 by means of bolts, and the overall structure is kept gas-tight by means of O-rings 27.

The lower flange 23 is connected to one end of the pipe 14 via a joint 28 and the other end of the pipe 14 is connected to the ozone generating cell 11 shown in FIG. 1. The upper flange 23 is connected to one end of the pipe 15 via a joint 28 and the other end of the pipe 15 is connected to the filter 13 shown in FIG. 1. When the ozone gas emerging from the ozone generating cell 11 is passed through the pipe 14 to be admitted into the outer tube 22, it flows through the lower mesh plate 25, the NOx adsorbent 21 and the upper mesh plate 25 in that order, thence flowing into the pipe 15. As the ozone gas flows through the NOx adsorbent 21, the NOx in the ozone gas is adsorbed on the NOx adsorbent 21.

The respective components of the NOx removing means 12 are made of the following constituent materials: flanges 23, outer tube 22 and retainer rings 26 are formed of pure aluminum, Ni-coated stainless steel or Teflon; the mesh plate 25, Teflon; the O-rings 27, a fluorocarbon elastomer; and the NOx adsorbent 21, zeolite. Zeolite is capable of adsorbing more NOx, HF and SOx than ozone gas. In addition, the ozone gas contains very small amounts of NOx, HF and SOx. Therefore, if an ozone gas containing small amount of NOx, HF and SOx is passed through the zeolite, the ozone gas will soon reach an equilibrium in adsorption and will not be adsorbed any further; on the other hand, NOx, HF and SOx will be kept adsorbed for an extended period of time. This is the theory behind the effective removal of NOx, HF and SOx from the ozone gas.

FIG. 3 shows another schematic layout of the ozonizer of the present invention. In FIG. 3, the parts which are the same as or equivalent to those shown in FIG. 1 are identified by like numerals. Shown by 16 is a glass or Teflon vessel (water tank) filled with pure water 17. The ozone gas emerging from the ozone generating cell 11 is passed through the pipe 14 and thence diffused into the pure water 17 in the tank 16. The ozone gas passed through the pure water 17 leaves the top of the tank 16 and is thence passed through the pipe 15 to be introduced into a dehumidifier 18 wherein it is dehumidified to produce a dry ozone gas which is then sent to a subsequent process.

Provided at the distal end of the pipe 14 is a diffuser portion (not shown) which has a multiple of fine apertures with diameters of, say, about 10–100 pm, through which the ozone gas is forced and divided into minute bubbles. The dehumidifier 18 need to be employed when the subsequent process hates moisture and may be omitted if it does not hate moisture. The dehumidifier 18 may operate on any mechanism such as condensation or adsorption.

With the ozone gas being diffused into the pure water 17 in the manner described above, the NOx in the ozone gas is dissolved into the pure water 17 and hence removed from the ozone gas. The foregoing description is directed to removing NOx from the ozone gas which is generated when oxygen ($O_2$) gas supplemented with nitrogen ($N_2$) gas is fed to the ozone generating cell 11. If the feed gas is oxygen ($O_2$) gas supplemented with $CF_4$, $SF_6$ and $NF_3$, the product ozone gas will contain HF and SOx; in this case, too, the ozone gas may be diffused into the pure water 17, whereby the contained HF and SOx will dissolve in the pure water 17 to be removed from the ozone gas.

Water is capable of dissolving more NOx, HF and SOx than the ozone gas. In addition, the ozone gas contains very small amounts of NOx, HF and SOx. Therefore, if an ozone gas containing small amounts of NOx, HF and SOx is passed through pure water, the ozone gas will soon reach an equilibrium in dissolution and will not be adsorbed any further; on the other hand, NOx, HF and SOx in the ozone gas will kept adsorbed for an extended period of time. This is the theory behind the effective removal of NOx, HF and SOx from the ozone gas.

As described on the foregoing pages, the ozone gas transport path which is located downstream of the ozone generating cell in the ozonizer of the invention is provided with means for removing the NOx, HF and SOx contained in the product ozone gas. An outstanding effect that is obtained by this provision is that even if the ozone gas transport path located downstream of said removing means uses a stainless steel and other Cr-containing materials in those areas which are to come into contact with the ozone gas, there will be no possibility that the product ozone gas is contaminated by Cr compounds.

The present invention will now be described in greater detail with reference to examples but it should be understood that the invention is by no means limited to those examples.

EXAMPLE 1

Figure 4:
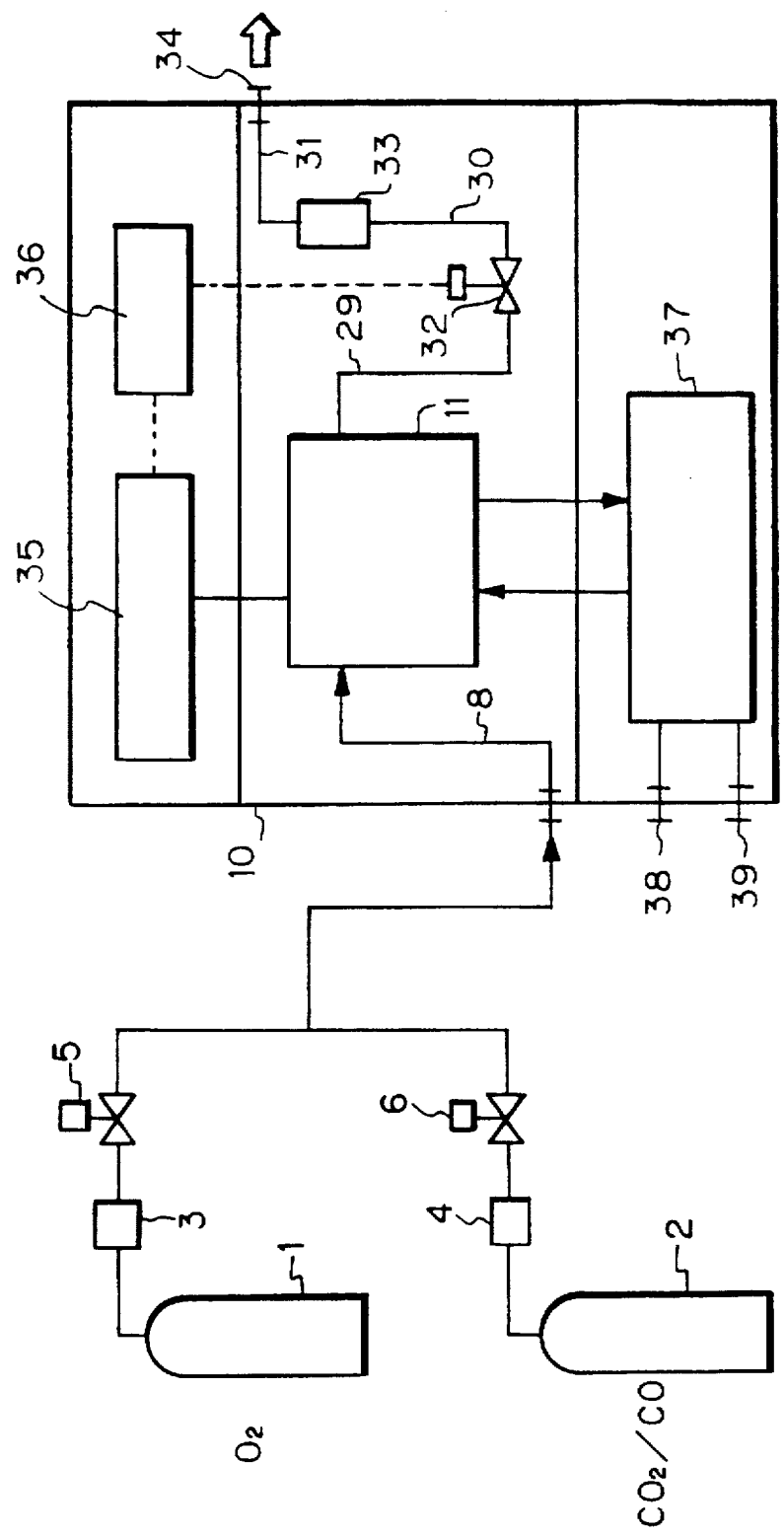
FIG. 4 shows a schematic layout of the ozonizer according to the third aspect of the invention.

FIG. 4 shows a schematic layout of the ozonizer according to the third aspect of the invention.

In FIG. 4, numeral 1 designates an oxygen gas source and 2 is a carbon dioxide and/or carbon monoxide gas source. The gases emerging from these gas sources are pressure controlled with regulators 3 and 4, have their flow rates adjusted to be constant by means of mass flow controllers and are thence supplied as a feed gas to an ozonizer 10. Alternatively, a premix of an oxygen gas with carbon dioxide or carbon monoxide may be used as a feed gas source.

The ozone generating cell 11 contains one or more unit cells (not shown), which are each connected to a pressure regulating valve 32 via a pipe 29. The pressure regulating valve 32 is connected to a gas filter 33 via a pipe 30, and the gas filter 33 is connected to an ozone gas outlet 34 via a pipe 31. The pipe 29, pressure regulating valve 32, pipe 30, gas filter 33 and pipe 31 form an ozone gas delivery path through which ozone gas is delivered from the ozone generating cell 11. As will be described hereinafter, those parts of the ozone gas delivery path which are to come into contact with the ozone gas use a stainless steel material.

A high-frequency, high voltage source 35 is provided to apply a high-frequency, high voltage to the electrodes of the ozone generating cell 11 under the control of a control unit 36. The pressure regulating valve 32 regulates the pressure in the ozone generating cell 11 at a specified level under the control of the control unit 36. The gas filter 33 removes fine particles and other impurities contained in the ozone gas being sent from the ozone generating cell 11.

A chiller unit 37 is provided to supply the ozone generating cell 11 with circulating deionized water. The chiller unit 37 is so adapted that cooling water flows in through an inlet 38 and flows out through an outlet 39. The introduced cooling water cools the deionized water from the ozone generating cell 11 and sends it back to the latter. In this way, the heat generated by a discharge such as silent discharge that develops within the ozone generating cell 11 can be removed, thereby cooling the cell.

In the thus constructed ozonizer, the ozone generating cell 11 is supplied not only with a specified high-frequency, high voltage from the power source 35 and a feed gas from the gas sources 1 and 2, and ozone gas is generated in the cell. The generated ozone gas flows through the pipe 29 and passes through the pressure regulating valve 32 to enter the gas filter 33. After being free of fine particles and other impurities by means of the filter 33, the ozone gas flows through the pipe 31 and leaves the ozonizer through the outlet 34 to be sent to a subsequent process, say, a semiconductor fabrication process.

The ozone generating cell 11 had the specifications set forth below and the ozonizer was operated under the conditions also set forth below.

| (Specifications) | |
| --- | --- |
| Electrode geometry | Trench type |
| Electrode materials | Sapphire dielectric plate for high-voltage side and dielectric coated pure aluminum for grounded side |
| Cooling method | Both electrodes cooled with deionized water |
| Discharge voltage | 9.5 $kV_{p-p}$ |
| Discharge frequency | 12 kHz |
| (Operating conditions) | |
| Feed gas pressure | 1.0 $kgf/cm^2G$ |
| Feed gas flow rate | 7.5 NL/min |
| Flow rate of deionized cooling water | 20 L/min |
| Temperature of deionized cooling water | 20° C. |

Figure 5:
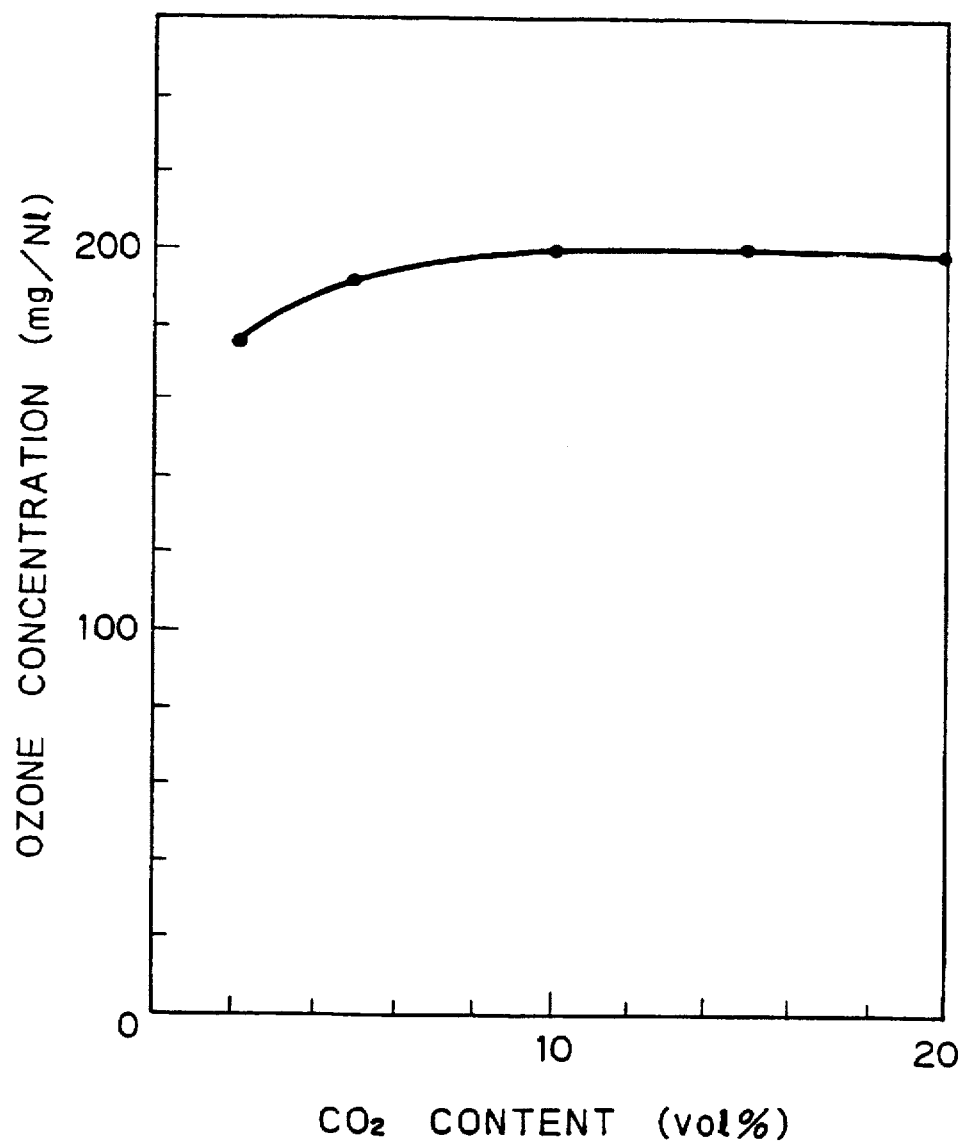
FIG. 5 is a graph showing the relationship between the $CO_2$ content and the ozone concentration.

FIG. 5 is a graph showing the relationship between the $CO_2$ content and the ozone concentration. By using a feed gas that consists of oxygen ($O_2$) supplemented with carbon dioxide ($CO_2$) or carbon monoxide (CO), a NOx-free ozone gas can be produced from the ozone generating cell 11, so that even if the ozone gas delivery path located downstream of the ozone generating cell 11 which consists of the pipe 29, pressure regulating valve 32, pipe 30, gas filter 33 and pipe 31 uses a stainless steel material in those parts which are to come into contact with the ozone gas, the product ozone gas emerging from the ozonizer through the outlet 15 does not contain Cr compounds and hence can be delivered to a subsequent process as a Cr contamination-free ozone gas.

Figure 6:
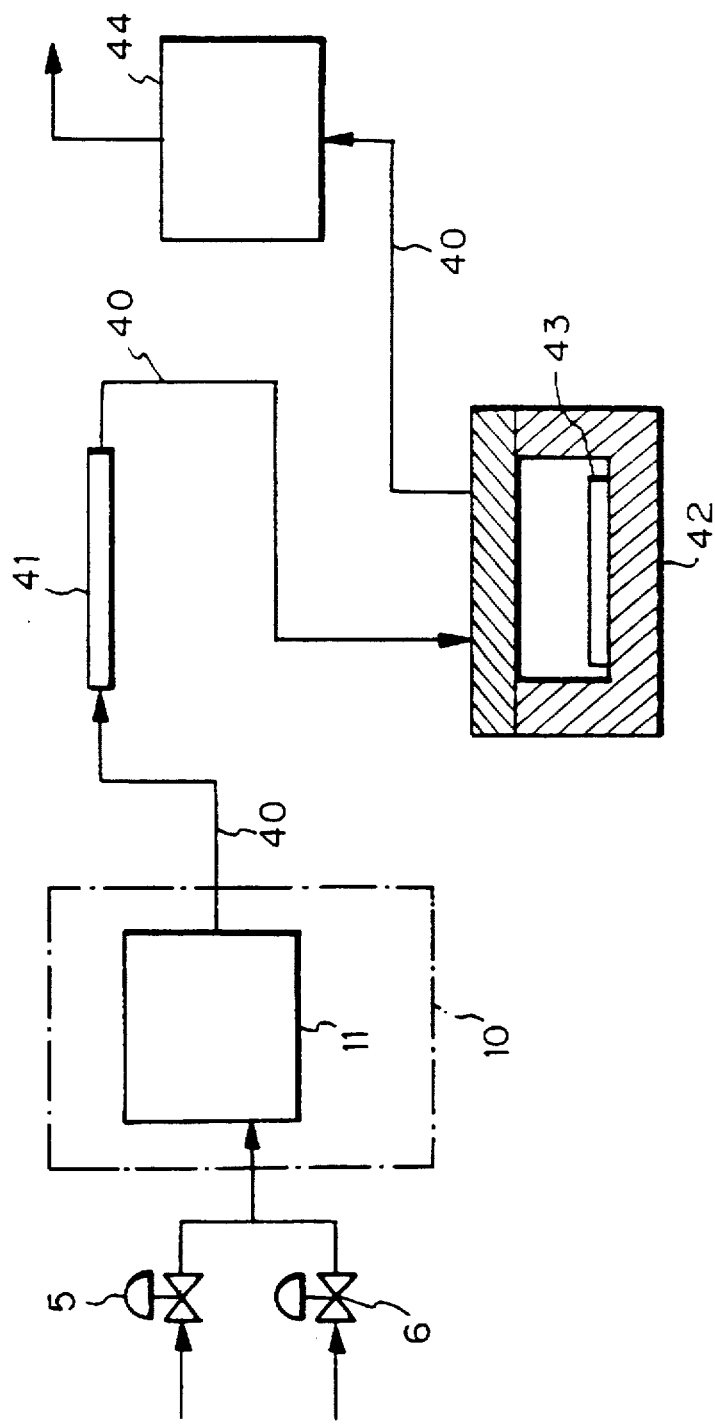
FIG. 6 is a schematic representation of a system for checking the amount of Cr contamination.

FIG. 6 is a schematic representation of a system for checking the amount of Cr contamination. In FIG. 6, numeral 10 refers to an ozonizer and 11 designates an ozone generating cell. The ozone generating cell 11 which was supplied with a high-frequency high voltage between electrodes was also supplied with oxygen and carbon dioxide ($CO_2$) or nitrogen gases at given flow rates; the oxygen gas was supplied from an oxygen ($O_2$) gas mass flow controller 5 and the carbon dioxide ($CO_2$) or nitrogen gas was supplied as a make-up gas from a $CO_2$ or $N_2$ gas mass flow controller 6. The ozone gas generated in the cell 11 passed through a Teflon pipe 40, a stainless steel pipe 41 and a Teflon pipe 40, from which it was blown into a Teflon chamber 42; the ozone gas from the Teflon chamber 42 was directed through a Teflon pipe 40 to enter an ozone cracking column 44, from which a cracked ozone gas would emerge.

The chamber 42 contained a silicon wafer 43 and the amount of Cr deposit on the surface of the silicon wafer 43 was analyzed by a total reflecting fluorescent X-ray analyzer (not shown) to check the amount of Cr contamination.

The conditions for the test conducted with the system shown in FIG. 6, as well as the results of the test are set forth below.

| Test conditions | |
|---|---|
| Ozone gas concentration | 8 vol % |
| Feed gas flow rate | 10 NL/min |
| Pressure in ozone generating cell | atmospheric pressure |
| Feed gas purity | 99.9995% for both oxygen ($O_2$) and nitrogen ($N_2$) and 99.999% for carbon dioxide ($CO_2$) |
| Ozone gas blow time | 10 min |
| Diameter of silicon wafer 24 | 6 inch |

TEST RESULTS (1) Cr contamination in the case where the feed gas was oxygen ($O_2$) gas supplemented with 0.8 vol % nitrogen ($N_2$) gas: $1\times10^{12}$–$1\times10^{13}$ atms/cm$^2$;

(2) Cr contamination in the case where the feed gas was oxygen ($O_2$) gas supplemented with 12 vol % carbon dioxide ($CO_2$) gas: $<1\times10^{10}$ atms/cm (below the limit of detection with a total reflecting fluorescent X-ray analyzer).

Thus, the ozonizer of the invention has the advantage that even if the ozone gas flow path extending from the outlet 34 to a subsequent process of using the generated ozone gas employs a stainless steel material in at least those parts which are to come into contact with the ozone gas, a clean ozone gas which is not contaminated by Cr compounds can be sent to the subsequent process.

While the foregoing example concerns the use of carbon dioxide as a make-up gas to be added to oxygen, it should be noted that similar results were obtained when carbon monoxide was used as a make-up gas.

EXAMPLE 2

Figure 7:
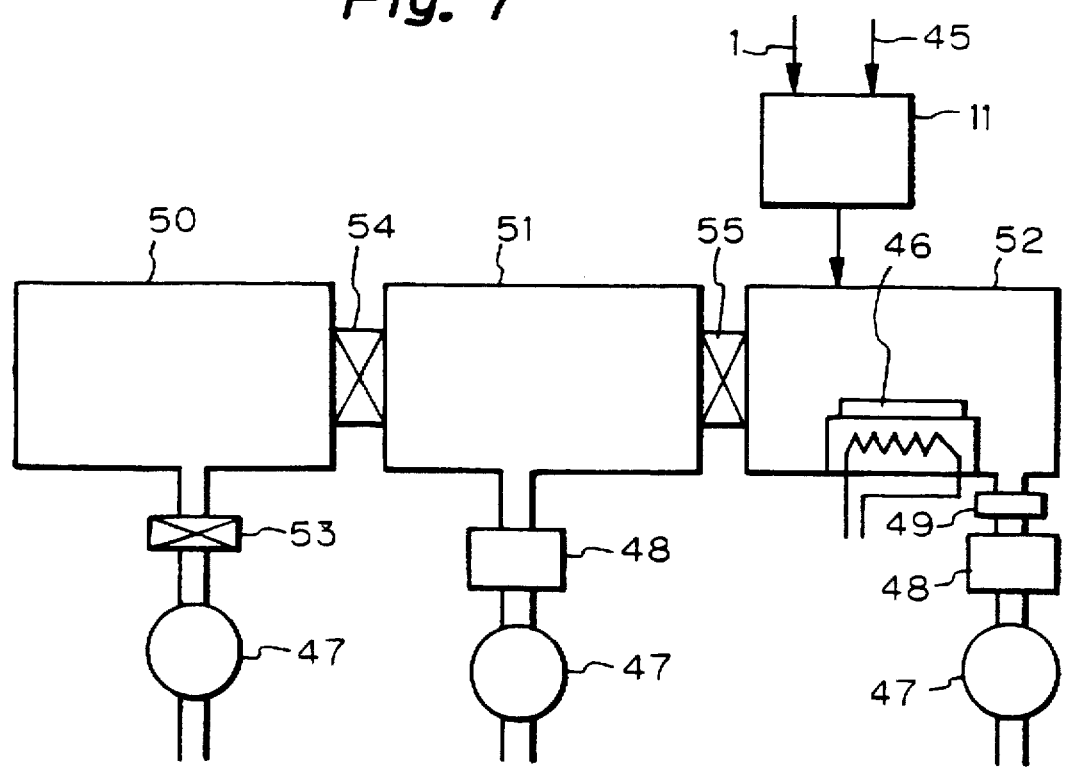
FIG. 7 shows a schematic layout of an apparatus used to form a metal oxide according to the invention.

FIG. 7 shows an experimental setup used in forming a metal oxide according to the fourth aspect of the invention. The apparatus was a sheet-fed oxidizer comprising a load lock chamber 50, a transport chamber 51 and an oxidizing chamber 52 which was connected to an ozone generator 11. The ozone generator 11 was supplied with a mixture of oxygen gas 1 with a purity of at least five nines (99.999%) and at least one gas 45 with a purity of at least five nines (99.999%) selected from among nitrogen, carbon dioxide and carbon monoxide gases. The oxygen gas 1 had been treated with a purifier to have a dew point of 90° C. or below. Using this mixture as a feed gas, the ozone generator 11 was supplied with a high voltage between electrodes to generate ozone. The generated ozone was supplied through a SUS 316L pipe into the oxidizing chamber 52, which contained a heater capable of heating a Si substrate 46 up to 1,000° C. The load lock chamber 50 was connected to a drying pump 47. The transport chamber 51 was connected to a turbo-molecular pump 48 and a drying pump 47. The oxidizing chamber 52 was connected to a turbo-molecular pump 48 and a drying pump 47 via a conductance valve 49. The respective chambers were capable of pressure adjustment from one atmosphere to $10^{-1}$ Pa, at $10^{-4}$ Pa and from 500 to $10^{-4}$ Pa. Chamber 50 was isolated from the atmosphere by means of a gate valve 53; chambers 50 and 51 were isolated from each other by means of a gate valve 54; and chambers 51 and 52 were isolated from each other by means of a gate valve 55.

Using the apparatus shown in FIG. 7, an oxide film was formed by the following method. First, Si substrate 46 was placed in a cassette in the load lock chamber 50, which was then evacuated to 0.1 Pa. Thereafter, gate valves 54 and 55 were opened and the substrate 46 was transported into the oxidizing chamber 52. Thereafter, gate valve 55 was closed and the substrate 46 was heated up to 850° C. with the pressure in the oxidizing chamber 52 kept at $10^{-4}$ Pa. When the temperature of the substrate 46 had reached the desired level, 8 vol % ozone was admitted into the oxidizing chamber 52 while the pressure in it was controlled at 400 Pa by adjustment of the conductance valve 49. Thus, the Si substrate 46 was oxidized to form a silicon oxide film of a thickness of 8 nm. The oxidizing rate was 0.5 nm/min. When an ozone gas prepared from a mixture with $N_2$ was used, the oxidizing rate was inconsistent. The thus deposited films were analyzed for impurities by atomic absorption and SIMS. The results are shown in Table 1 below.

TABLE 1

| | Impurities in Silicon Oxide Films | | | |
|---|---|---|---|---|
| | Fe | Ni | Cr | C |
| | (atomic absorption) | | | (SIMS) |
| $O_2$ + 12% $CO_2$ | N.D.* | N.D. | N.D. | N.D. |
| $O_2$ + 0.8% $N_2$ | N.D. | N.D. | $5 \times 10^{12}$ | N.D. |
| $O_2$ | N.D. | N.D. | N.D. | N.D. |
| Detection limit | $4 \times 10^9$ atoms/cm$^2$ | $2 \times 10^9$ atoms/cm$^2$ | $4 \times 10^9$ atoms/cm$^2$ | $1 \times 10^{18}$ atoms/cm$^3$ |

*N.D. = below detection limit

Table I shows that when the ozone gas prepared in accordance with the prior art from a mixture of oxygen gas 1 with 0.8 vol % nitrogen gas 45 supplied through the SUS pipe to oxidize the Si substrate, the resulting silicon oxide film contained a detectable amount of Cr. As already mentioned in connection with the prior art, this phenomenon would be due to the Cr contamination that occurs as a result of etching of the Cr oxides on the inner surface of the SUS pipe as a product of the reaction between the NOx in the ozone gas and the $H_2O$ adsorbed on the inner surface of the SUS pipe. However, when the ozone gas prepared in accordance with the invention from a mixture of oxygen gas 1 with 12 vol % carbon dioxide gas 45 was supplied through the SUS pipe to oxidize the Si substrate, the resulting silicon oxide film did not contain Cr.

This would be due to the absence of NOx from the ozone gas which would otherwise cause the etching of Cr oxides. Table 1 also shows that the silicon oxide film was free from the contamination by C and other organic matters despite the presence of 12 vol % $CO_2$. This would be due to the strong oxidizing power of the ozone gas. Hence, silicon oxide films that are formed in accordance with the fourth aspect of the invention are as low in impurity levels as those silicon oxide films which are produced by oxidizing Si substrates with $O_2$ gas in an oxidizing furnace of a hot-wall type.

Figure 8:
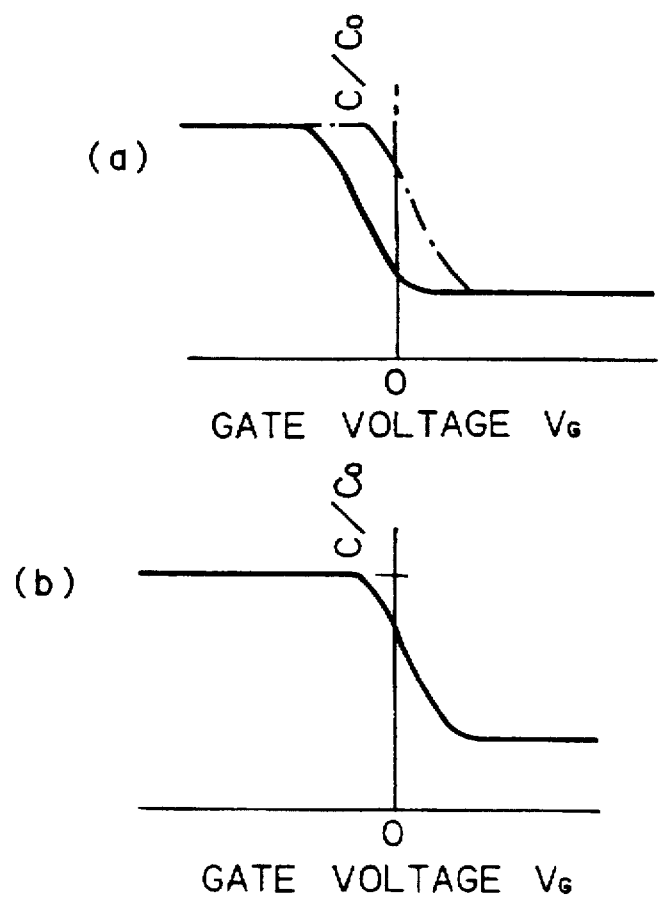
FIGS. 8a and 8b show the C-V characteristics of two silicon oxide films.

In another experiment, p-type Si substrates (face orientation =100; specific resistance =10 Ω.cm) were oxidized by the above-described method to form silicon oxide films in a thickness of 100 nm. The silicon oxide films were each overlaid with n-type polycrystalline Si electrodes (0.1 cm$^2$ wide) to prepare MOS capacitors, which were evaluated for C-V characteristics. The results are shown in FIGS. 8a and 8b. As FIG. 8a shows, the MOS capacitor that employed the silicon oxide film prepared by oxidizing the Si substrate the ozone gas generated in accordance with the prior art from a mixture of oxygen gas 1 and 0.8 vol % nitrogen gas 45 experienced a change of about −1 V in flat band voltage ($\Delta V_{FB}$). Although the exact reason for this phenomenon is not clear, the surface energy level created by the Cr in the deposited film would have had some effect. On the other hand, the MOS capacitor that employed the silicon oxide film prepared by oxidizing the Si substrate with the ozone gas generated in accordance with the invention from a mixture of oxygen gas 1 and 12 vol % carbon dioxide gas 45 did not experience any change in $\Delta V_{FB}$ (see FIG. 8b).

The silicon oxide films prepared by the two methods described above were evaluated for their withstand voltages. Whether they were prepared by oxidizing the Si substrate with the ozone gas generated from a mixture of oxygen gas 1 and 0.8 vol % nitrogen gas 45 or from a mixture of oxygen gas 1 and 12 vol % carbon dioxide 45, the silicon oxide films could withstand voltages of 10 MV/cm and above in at least 90% of the 20 points of measurement. On the other hand, the silicon oxide film prepared by oxidizing the Si substrate in an oxidizing furnace of a hot-wall type could withstand voltages of 10 MV/cm and higher in only 50% of the points of measurement. Although the exact reason for this phenomenon is not clear, the removal of organic matter from the substrate surface would have been a factor.

While the foregoing example is directed to the method of forming silicon oxide films using 8 vol % ozone gas that was prepared from a mixture of $O_2$ and 12 vol % $CO_2$, it should be added that similar results were obtained using ozone gas that was prepared from mixtures of $O_2$ and 10 –20 vol % $CO_2$ or CO. This was also true with the case where the ozone concentration was varied from 3 to 10 vol %.

Another advantage of using the ozone gas prepared in accordance with the second aspect of the invention is that organic films (resist films) applied to substrates can be removed while preventing their Cr contamination.

EXAMPLE 3

Figure 9:
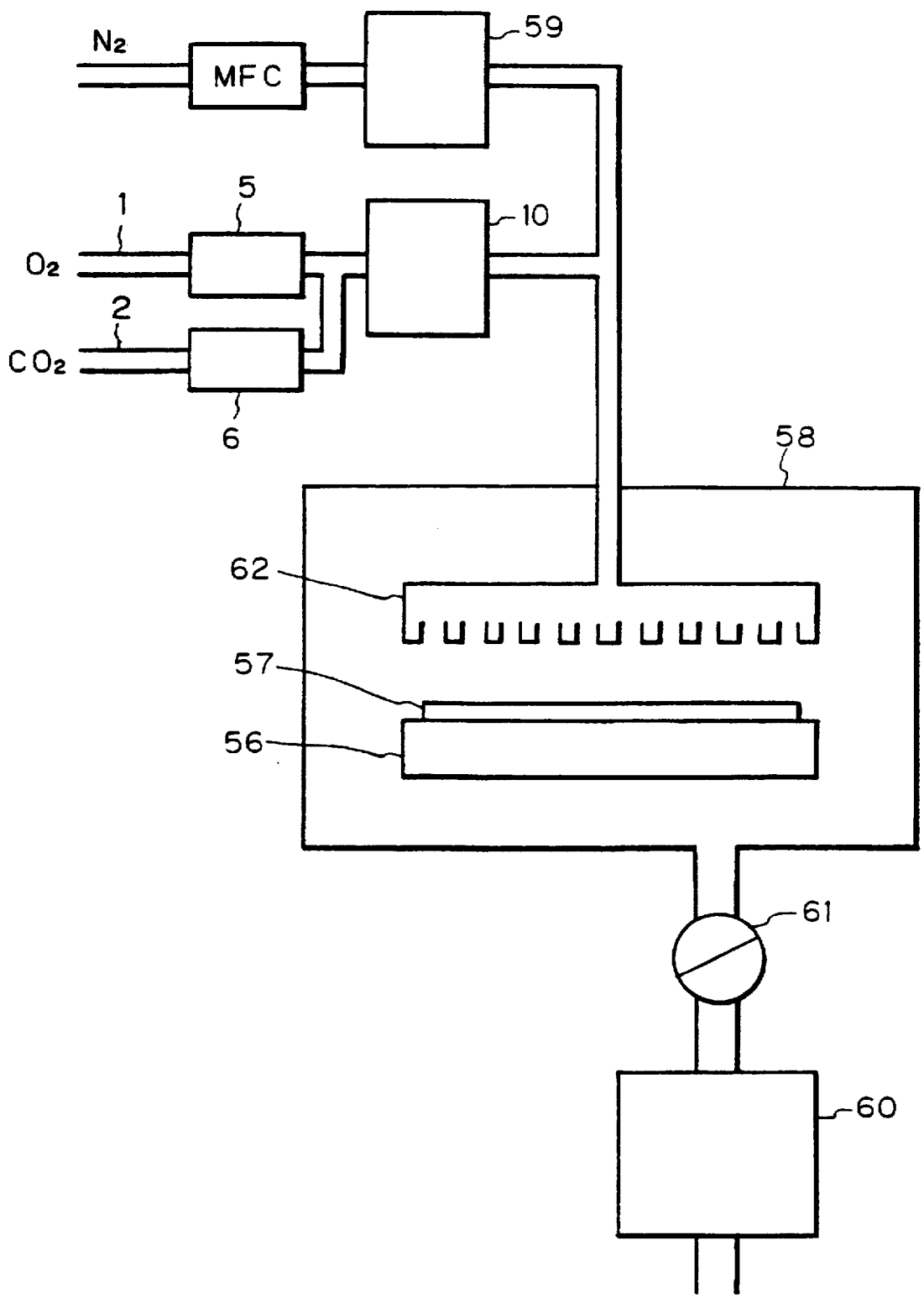
FIG. 9 shows a schematic layout of an apparatus for film formation according to the invention as it is applied to a CVD process.

The present invention may be applied to a chemical vapor-phase growth process (CVD) and an apparatus for film formation by this process is shown schematically in FIG. 9. Indicated by 58 in FIG. 9 is a CVD chamber, which is supplied with source gases from a TEOS feeder 59 and an $O_3$generator 10; the source gases are blown through a shower head 62 to be directed against a wafer. The CVD chamber 58 is evacuated through an exhaust port of evacuator.

The following description concerns the use of tetraethoxysilane (TEOS) as an organosilane compound. To deposit a silicon oxide film, wafer 57 was first set on heater 56 which was preset at 400° C. Ozone generator 11 was supplied with $O_2$ and $CO_2$ at respective flow rates of 5 NL/min and 750 Ncc/min to generate $O_3$, which was supplied to CVD chamber 58.

The generated $O_3$had a concentration of 8 vol %, which was comparable to the level attained by addition of 0.8% $N_2$.

With the $O_3$being kept flowing into the CVD chamber, the pressure in the latter was held at 53 kPa and TEOS borne on carrier $N_2$ (4 NL/min) was admitted into the CVD chamber at a flow rate of 20 Ncc/min, thereby forming a silicon oxide film. This film had such a thickness that it could serve as a dielectric film necessary to form a desired semiconductor device.

Under the film forming conditions employed, it was possible for the silicon oxide film to fill a groove (aperture width, 0.35μ; aspect ratio, 3) without leaving voids. The film was also free from the Cr contamination which was common in the prior art. In addition, the other properties of the film were comparable to those of the film prepared by the prior art (see Table 2 below). The concentration of carbon in the film prepared in accordance with the invention was below the limit of detection by SIMS and, hence, the addition of $CO_2$ or CO caused no detectable effects.

TABLE 2

|  | Prior art | Invention |
| --- | --- | --- |
| $NH_4F$ etch rate, nm/min | 570 | 570 |
| Refractive index | 1.45 | 1.45 |
| Stress, MPa | +200 | +200 |
| Cr contamination, atms/cm$^2$ | $1 \times 10^{11}$ | $\leq 5 \times 10^{9}$ |

The silicon oxide films formed using ozone gas that was prepared from the mixture of $O_2$ with CO, or CO could withstand higher voltages than the films formed using ozone gas that was prepared from the mixture of $O_2$ with $N_2$. In addition, the former films had a smoother surface although the exact reaction mechanism behind that effect is not known.

It may be added that if $O_3$is to be used at lower concentrations, the concentrations of $CO_2$ and CO may accordingly be lowered.

As described on the foregoing pages, the present invention is characterized by supplying an ozonizer with a feed gas that consists of oxygen ($O_2$) gas supplemented with carbon dioxide ($CO_2$) gas and/or carbon monoxide (CO) gas. This offers the advantage that even if the ozone gas transport path which is located downstream of the ozone generating cell uses a stainless steel material in at least those parts which are to come into contact with the ozone gas, there is no possibility that Cr compounds are generated in the ozone gas transport path downstream of the ozone generating cell and one can produce a clean ozone gas that is not contaminated by Cr compounds.

The thus produced ozone gas may be used in the manufacture of metal oxide films, in particular, silicon oxide films, without Cr and other contaminants.

What is claimed is:

1. A method of forming a silicon oxide film onto a silicon substrate, comprising the steps of:
    providing a feed gas consisting essentially of an oxygen gas supplemented with 12 to 20 percent by volume of a supplement gas consisting essentially of one of carbon dioxide, carbon monoxide, and a mixture thereof;
    applying a voltage to the feed gas to generate an ozone-containing gas, the supplement gas inhibiting contamination of the ozone-containing gas with a chromium compound; and
    contacting the ozone-containing gas with at least one of silicon and an organosilane compound to react the ozone in the ozone-containing gas with said at least one of silicon and the organosilane compound to produce the silicon oxide film.

2. A method of claim 1, wherein the ozone-containing gas is contacted with a silicon substrate to form the silicon oxide film thereon.

3. A method of claim 1, wherein the organosilane compound comprises tetraethoxysilane.

4. A method of removing an organic compound in a feed gas, comprising the steps of:
    providing a feed gas consisting essentially of oxygen gas and an organic compound;

adding to the feed gas 12 to 20 percent by volume of a supplement gas consisting essentially of one of carbon dioxide, carbon monoxide, and a mixture thereof;

applying a voltage to the feed gas to generate an ozone-containing gas, the supplement gas inhibiting contamination of the ozone-containing gas with a chromium compound; and oxidizing the organic compound in the feed gas by the ozone in the ozone-containing gas to remove the organic compound.

5. A method of claim 4, wherein 12 to 20 percent by volume of said supplement gas is added to the feed gas.

* * * * *